(12) United States Patent
Kato et al.

(10) Patent No.: US 7,518,558 B2
(45) Date of Patent: *Apr. 14, 2009

(54) WIRELESS IC DEVICE

(75) Inventors: Noboru Kato, Moriyama (JP); Satoshi Ishino, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/042,399

(22) Filed: Mar. 5, 2008

(65) Prior Publication Data

US 2008/0143630 A1 Jun. 19, 2008

Related U.S. Application Data

(63) Continuation of application No. PCT/JP2007/054051, filed on Mar. 2, 2007.

(30) Foreign Application Priority Data

Apr. 14, 2006 (JP) .............................. 2006-112351

(51) Int. Cl.
H01Q 1/38 (2006.01)
H01Q 9/28 (2006.01)
G08B 13/14 (2006.01)

(52) U.S. Cl. ................................ 343/700 MS; 343/795; 340/572.7

(58) Field of Classification Search .......... 343/700 MS, 343/795, 873; 340/572.7
See application file for complete search history.

(56) References Cited

U.S. PATENT DOCUMENTS 3,364,564 A 1/1968 Kurtz et al.
4,794,397 A 12/1988 Ohe et al.
5,253,969 A 10/1993 Richert
5,337,063 A 8/1994 Takahira
5,399,060 A 3/1995 Richert
5,491,483 A 2/1996 D'Hont
5,757,074 A 5/1998 Matloubian et al.
5,903,239 A 5/1999 Takahashi et al.
5,955,723 A 9/1999 Reiner
5,995,006 A 11/1999 Walsh
6,107,920 A * 8/2000 Eberhardt et al. ........ 340/572.7
6,172,608 B1 1/2001 Cole (Continued)

FOREIGN PATENT DOCUMENTS

EP 0 977 145 A2 2/2000

(Continued)

OTHER PUBLICATIONS

Official communication issued in the International Application No. PCT/JP2007/054051, mailed on Jun. 5, 2007.

(Continued)

*Primary Examiner*—Shih-Chao Chen
(74) *Attorney, Agent, or Firm*—Keating & Bennett, LLP

(57) ABSTRACT

A wireless IC device includes a flexible sheet provided with a wireless IC chip and radiation plates. The wireless IC chip is connected by an Au bump to a feeder circuit which is located on the sheet and which has a predetermined resonant frequency and a predetermined impedance. The feeder circuit includes electrode patterns, and the feeder circuit and the radiation plates are capacitively coupled with each other through the flexible sheet.

9 Claims, 3 Drawing Sheets

U.S. PATENT DOCUMENTS

| | | |
|---|---|---|
| 6,181,287 B1 | 1/2001 | Beigel |
| 6,190,942 B1 | 2/2001 | Wilm et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,828,881 B2 | 12/2004 | Mizutani et al. |
| 6,927,738 B2 | 8/2005 | Senba et al. |
| 6,963,729 B2 | 11/2005 | Uozumi |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 * | 7/2008 | Sakama et al. ............ 340/572.7 |
| 2002/0011967 A1 | 1/2002 | Goff et al. |
| 2002/0044092 A1 | 4/2002 | Kushihi |
| 2002/0067316 A1 | 6/2002 | Yokoshima et al. |
| 2004/0001027 A1 | 1/2004 | Killen et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0158380 A1 | 7/2006 | Son et al. |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0252700 A1 | 11/2007 | Ishihara et al. |
| 2007/0285335 A1 | 12/2007 | Bungo et al. |
| 2008/0024156 A1 | 1/2008 | Arai et al. |
| 2008/0169905 A1 | 7/2008 | Slatter |
| 2008/0272885 A1 | 11/2008 | Atherton |

FOREIGN PATENT DOCUMENTS

| | | |
|---|---|---|
| JP | 50-143451 A | 11/1975 |
| JP | 62-127140 U | 8/1987 |
| JP | 05-327331 A | 12/1993 |
| JP | 6-53733 A | 2/1994 |
| JP | 06-077729 A | 3/1994 |
| JP | 06-177635 A | 6/1994 |
| JP | 07-183836 A | 7/1995 |
| JP | 08-056113 A | 2/1996 |
| JP | 8-87580 A | 4/1996 |
| JP | 11-149537 A | 6/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-245381 A | 9/1997 |
| JP | 09-252217 A | 9/1997 |
| JP | 09-270623 | 10/1997 |
| JP | 10-505466 A | 5/1998 |
| JP | 10-171954 A | 6/1998 |
| JP | 10-293828 A | 11/1998 |
| JP | 11-149538 A | 6/1999 |
| JP | 11-219420 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2005-229474 A | 1/2000 |
| JP | 2000-059260 A | 2/2000 |
| JP | 2000-085283 A | 3/2000 |
| JP | 2000-132643 A | 5/2000 |
| JP | 2000-137778 A | 5/2000 |
| JP | 2000-148948 A | 5/2000 |
| JP | 2000-172812 A | 6/2000 |
| JP | 2000-510271 A | 8/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2001-028036 A | 1/2001 |
| JP | 2007-18067 A | 1/2001 |
| JP | 2001-66990 A | 3/2001 |
| JP | 2001-168628 A | 6/2001 |
| JP | 2001-256457 A | 9/2001 |
| JP | 2001-514777 A | 9/2001 |
| JP | 2001-319380 A | 11/2001 |
| JP | 2001-331976 A | 11/2001 |
| JP | 2001-332923 A | 11/2001 |
| JP | 2001-344574 A | 12/2001 |
| JP | 2001-351084 A | 12/2001 |
| JP | 2002-024776 A | 1/2002 |
| JP | 2002-042076 A | 2/2002 |
| JP | 2002-50645 A | 2/2002 |
| JP | 2002-76750 A | 3/2002 |
| JP | 2002-150245 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-230128 A | 8/2002 |
| JP | 2002-298109 A | 10/2002 |
| JP | 2002-319008 A | 10/2002 |
| JP | 2002-362613 A | 12/2002 |
| JP | 2002-373029 A | 12/2002 |
| JP | 2002-373323 A | 12/2002 |
| JP | 2003-016412 A | 1/2003 |
| JP | 2003-030612 A | 1/2003 |
| JP | 2003-44789 A | 2/2003 |
| JP | 2003-58840 A | 2/2003 |
| JP | 2003-067711 A | 3/2003 |
| JP | 2003-076947 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-187207 A | 7/2003 |

| | | | |
|---|---|---|---|
| JP | 2003-187211 A | 7/2003 | |
| JP | 2003-198230 A | 7/2003 | |
| JP | 2003-209421 A | 7/2003 | |
| JP | 2003-218624 A | 7/2003 | |
| JP | 2003-233780 A | 8/2003 | |
| JP | 2003-242471 A | 8/2003 | |
| JP | 2003-243918 A | 8/2003 | |
| JP | 2003-288560 A | 10/2003 | |
| JP | 2003-309418 A | 10/2003 | |
| JP | 2003-332820 A | 11/2003 | |
| JP | 2004-88218 A | 3/2004 | |
| JP | 2004-096566 A | 3/2004 | |
| JP | 2004-253858 A | 9/2004 | |
| JP | 2004-287767 A | 10/2004 | |
| JP | 2004-297249 A | 10/2004 | |
| JP | 2004-326380 A | 11/2004 | |
| JP | 2004-334268 A | 11/2004 | |
| JP | 2004-336250 A | 11/2004 | |
| JP | 2004-343000 A | 12/2004 | |
| JP | 2004-362190 A | 12/2004 | |
| JP | 2004-362341 A | 12/2004 | |
| JP | 2004-362602 A | 12/2004 | |
| JP | 2005-136528 A | 5/2005 | |
| JP | 2005-165839 A | 6/2005 | |
| JP | 2005-167327 A | 6/2005 | |
| JP | 2005-191705 A | 7/2005 | |
| JP | 2005-210676 A | 8/2005 | |
| JP | 2005-210680 A | 8/2005 | |
| JP | 2005-217822 A | 8/2005 | |
| JP | 2005-236339 A | 9/2005 | |
| JP | 2005-244778 A | 9/2005 | |
| JP | 2005-275870 A | 10/2005 | |
| JP | 2005-295135 A | 10/2005 | |
| JP | 2005-311205 A | 11/2005 | |
| JP | 2005-321305 A | 11/2005 | |
| JP | 2005-335755 A | 12/2005 | |
| JP | 2005-346820 A | 12/2005 | |
| JP | 2005-352858 A | 12/2005 | |
| JP | 2006-031766 A | 2/2006 | |
| JP | 2006-39902 A | 2/2006 | |
| JP | 2006-67479 A | 3/2006 | |
| JP | 2006-72706 A | 3/2006 | |
| JP | 2006-80367 A | 3/2006 | |
| JP | 2006-92630 A | 4/2006 | |
| JP | 2006-102953 A | 4/2006 | |
| JP | 2006-148518 A | 6/2006 | |
| JP | 2006-195795 A | 7/2006 | |
| JP | 2006-270212 A | 10/2006 | |
| JP | 2006-309401 A | 11/2006 | |
| JP | 2007-65822 A | 3/2007 | |
| JP | 2007-150868 A | 6/2007 | |
| JP | 11-175678 A | 1/2009 | |
| NL | 9100176 A | 3/1992 | |
| NL | 9100347 A | 3/1992 | |
| WO | 03/079305 A1 | 9/2003 | |
| WO | 2004/036772 A1 | 4/2004 | |
| WO | 2004/070879 A | 8/2004 | |
| WO | 2004/072892 A1 | 8/2004 | |
| WO | 2005/073937 A2 | 8/2005 | |
| WO | 2005/115849 A1 | 12/2005 | |
| WO | 2006/045682 A1 | 5/2006 | |

OTHER PUBLICATIONS

Mukku-Sha, "Musen IC Tagu Katsuyo-no Subete" ("All About Wireless IC Tags"), RFID, pp. 112-126.
English translation of NL 9100176, published on Mar. 2, 1992.
English translation of NL 9100347, published on Mar. 2, 1992.
Kato et al.: "Antenna," U.S. Appl. No. 11/928,502, filed Oct. 30, 2007.
Kato et al.: Wireless IC Device, U.S. Appl. No. 12/211,117, filed Sep. 16, 2008.
Kato et al.: "Antenna," U.S. Appl. No. 11/688,290, filed Mar. 20, 2007.
Kato et al.: "Electromagnetic-Coupling-Module-Attached Article," U.S. Appl. No. 11/740,509, filed Apr. 26, 2007.
Kato et al.: "Product Including Power Supply Circuit Board," U.S. Appl. No. 12/234,949, filed Sep. 22, 2008.
Kato et al.: "Data Coupler," U.S. Appl. No. 12/252,475, filed Oct. 16, 2008.
Kato et al.; "Information Terminal Device," U.S. Appl. No. 12/267,666, filed Nov. 10, 2008.
Kato et al.: "Wireless IC Device and Wireless IC Device Composite Component," U.S. Appl. No. 12/276,444, filed Nov. 24, 2008.
Dokai et al.: "Optical Disc," U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System," U.S. Appl. No. 12/274,400, filed Nov. 20, 2008.
Kato: "Wireless IC Device," U.S. Appl. No. 11/964,185, filed Dec. 26, 2007.
Kato et al.: "Radio Frequency IC Device," U.S. Appl. No. 12/336,629, filed Dec. 17, 2008.
Kato et al.: "Wireless IC Device and Component for Wireless IC Device," U.S. Appl. No. 12/339,198, filed Dec. 19, 2008.
Ikemoto et al.: "Wireless IC Device," U.S. Appl. No. 11/851,651, filed Sep. 7, 2007.
Kataya et al.: "Wireless IC Device and Electronic Device," U.S. Appl. No. 11/851,661, filed Sep. 7, 2007.
Dokai et al.: "Antenna and Radio IC Device," U.S. Appl. No. 12/350,307, filed on Jan. 8, 2009.
Dokai et al.: "Wireless IC Device and Component for Wireless IC Device," U.S. Appl. No. 12/359,690, filed Jan. 26, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Dokai et al.: "Wireless IC Device, and Component for Wireless IC Device," U.S. Appl. No. 11/930,818, filed Oct. 31, 2007.
Dokai et al.: "Wireless IC Device and Component for Wireless IC Device," U.S. Appl. No. 11/624,382, filed Jan. 18, 2007.

* cited by examiner

WIRELESS IC DEVICE

BACKGROUND OF THE INVENTION

1. Field of the Invention

The present invention relates to wireless IC devices, and, in particular, to a wireless IC device used in an RFID (Radio Frequency Identification) system.

2. Description of the Related Art

In recent years, RFID systems have been developed as an article management system in which communication is established in a non-contact manner between a reader/writer that generates an induction field and an IC tag (hereinafter referred to as a wireless IC device) which is affixed to an article and which stores predetermined information, whereby information is exchanged. An example of a wireless IC device used in an RFID system is described in "Musen IC Tagu Katsuyo-no Subete" ("All About Wireless IC Tags"), Nikkei BP Mukku-sha, pp. 112-126.

A wireless IC device of the above-described type includes a wireless IC chip mounted on a strap substrate, and the strap substrate is connected to an antenna substrate. The wireless IC chip and the strap substrate are directly electrically connected to each other by an Au bump, and the strap substrate and the antenna substrate are directly, electrically connected to each other.

However, since, in the wireless IC device, a center frequency and impedance are set on an antenna side, in order for the device to be matched to a plurality of frequencies and impedances, it is necessary to provide separate antennas for the individual frequencies and impedances. Accordingly, the wireless IC device is not suitable for limited production of diversified products.

Also, since the strap substrate and the antenna substrate are directly electrically connected to each other, a heating step is required. Thus, materials which can be used for the antenna substrate are limited to heat resistant materials. In addition, when a junction location between the strap substrate and the antenna substrate shifts, the center frequency and impedance are changed. In particular, in frequency bands greater than the UHF band, even a minute change causes changes to the center frequency and the impedance. Thus, extremely high precision is required when manufacturing the wireless IC device.

SUMMARY OF THE INVENTION

To overcome the problems described above, preferred embodiments of the present invention provide a wireless IC device in which a frequency characteristic and an impedance can be determined without depending on an antenna and whose production is made easier.

A preferred embodiment of the present invention provides a wireless IC device having a flexible sheet provided with a wireless IC chip and radiation plates, wherein the wireless IC chip is connected to a feeder circuit which is provided on the sheet and which has a predetermined resonant frequency and a predetermined impedance, and wherein the feeder circuit and the radiation plates are coupled to each other.

In the wireless IC device according to this preferred embodiment of the present invention, the radiation plates have a function of radiating a transmitting signal supplied from the feeder circuit and a function of receiving and supplying a received signal to the feeder circuit. Transmission to and reception from the wireless IC chip is performed by the feeder circuit. The frequency of the transmitting signal radiated from the radiation plates and the frequency of the received signal supplied to the wireless IC chip are substantially determined by a resonant frequency of the feeder circuit. In other words, a center frequency is determined by the feeder circuit, regardless of the shape or configuration of the radiation plates. By changing only the feeder circuit, many different frequencies and impedances can be utilized, and, high precision is not required for connecting the feeder circuit and the radiation plates. In addition, if the radiation plates are rounded, and are sandwiched between dielectrics, a frequency characteristic does not change. An attachment location of the wireless IC device can be freely selected, and a stable frequency characteristic is obtained.

In the wireless IC device according to this preferred embodiment of the present invention, a cutout arranged to adjust the resonant frequency and the impedance is preferably provided in an electrode pattern of the feeder circuit. By changing the depth and width of the cutout, the resonant frequency and the impedance can be easily adjusted. In addition, by forming the radiation plates with flexible metal films on the sheet, handling of the wireless IC device is facilitated.

In addition, the wireless IC chip and the feeder circuit may be provided on a first main surface of the sheet, and the radiation plates may be provided on a second main surface opposite to the first main surface. The feeder circuit and the radiation plates may be capacitively coupled with each other through the sheet. A single sheet may be used for the wireless IC device, and the existence of a capacitor improves anti-surge functionality. A surge can be reduced by a capacitor since it is a current having a low frequency up to about 200 MHz, so that the wireless IC chip is prevented from being damaged or destroyed due to a surge.

In addition, the wireless IC chip and the feeder circuit may be disposed on a first main surface of a flexible first sheet, and the radiation plates may be disposed on a first main surface of a flexible second sheet. The sheets may be bonded to each other so that the first main surfaces of the sheets oppose each other, and the feeder circuit and the radiation plates may be coupled with each other. In this case, the feeder circuit and the radiation plates may be directly electrically coupled to each other or may be capacitively coupled through an adhesive layer. Since the wireless IC chip, the feeder circuit, and the radiation plates are coated with two sheets, these members are protected from the outside air and, for example, moisture. In addition, with capacitive coupling, the coupling does not require a heating step, and sheet materials can be selected without regard to the heat resistance of the materials.

Furthermore, the wireless IC chip and the feeder circuit may be provided on a first main surface of a flexible first sheet, and the radiation plates may be provided on a first main surface of a flexible second sheet. The sheets may be bonded to each other so that the first main surface of the first sheet and a second main surface opposite to the first main surface of the second sheet oppose each other, and the feeder circuit and the radiation plates may be capacitively coupled with each other by the second sheet. In this case, the coupling does not require a heating step.

According to preferred embodiments of the present invention, a frequency characteristic and impedance are determined by a feeder circuit without depending on radiation plates for signal transmission to and reception from the exterior. Thus, by changing the shape of an electrode pattern of the feeder circuit, various types of frequencies and impedances can be utilized, which is suitable for diversified production. In addition, high precision is not required when connecting the feeder circuit and the radiation plates. Thus, production is facilitated, which is particularly advantageous in producing a wireless IC device used in frequencies greater than the UHF band.

Other features, elements, steps, characteristics and advantages of the present invention will become more apparent from the following detailed description of preferred embodiments of the present invention with reference to the attached drawings.

BRIEF DESCRIPTION OF DRAWINGS

FIGS. 1A and 1B are exploded perspective views showing a first preferred embodiment of a wireless IC device according to the present invention; wherein FIG. 1A shows a back surface and FIG. 1B shows a front surface.

FIGS. 4A and 4B show a second preferred embodiment of the present invention; wherein FIG. 4A is a sectional view of a state before bonding, and FIG. 4B is a sectional view of a state after bonding.

FIGS. 5A and 5B show a third preferred embodiment of the present invention; wherein FIG. 5A is a sectional view of a state before bonding, and FIG. 5B is a sectional view of a state after bonding.

FIGS. 6A and 6B show a fourth preferred embodiment of the present invention; wherein FIG. 6A is a sectional view of a state before bonding, and FIG. 6B is a sectional view of a state after bonding.

DETAILED DESCRIPTION OF THE PREFERRED EMBODIMENTS

Figure 1A:
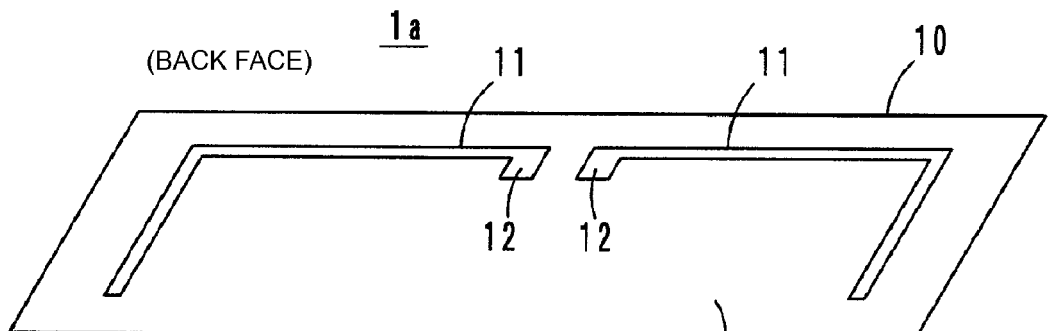

Preferred embodiments of a wireless IC device according to the present invention are described below with reference to the accompanying drawings. Common components and portions of the preferred embodiments described below are denoted by the same reference numerals, and repeated descriptions thereof are omitted.

First Preferred Embodiment

Figure 1B:
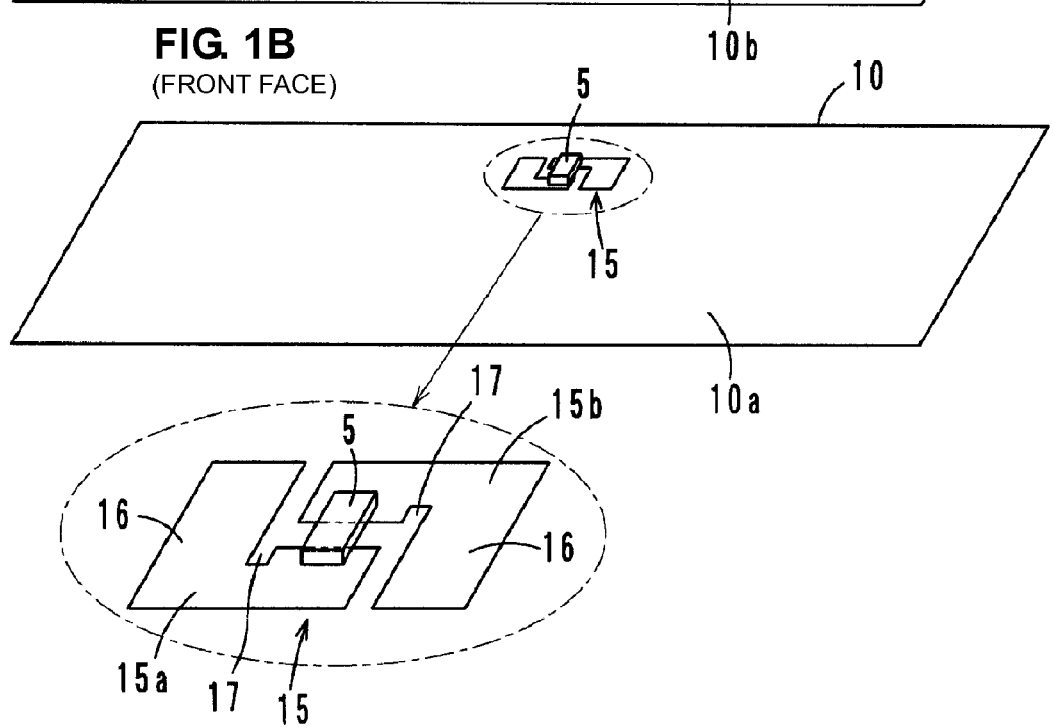

A wireless IC device 1a that is a first preferred embodiment is configured such that, as shown in FIG. 1A, radiation plates 11 are formed of a thin metal film, such as a flexible aluminum foil or metal deposition film on a second main surface (back surface) 10b of a flexible dielectric sheet 10 (for example, a resin film such as PET, or paper), and, as shown in FIG. 1B, a feeder circuit 15 is provided on a first main surface (front surface) 10a. A wireless IC chip 5 is mounted on the feeder circuit 15. FIG. 1B shows an enlarged view of the feeder circuit 15 on which the wireless IC chip 5 is mounted.

Figure 2:
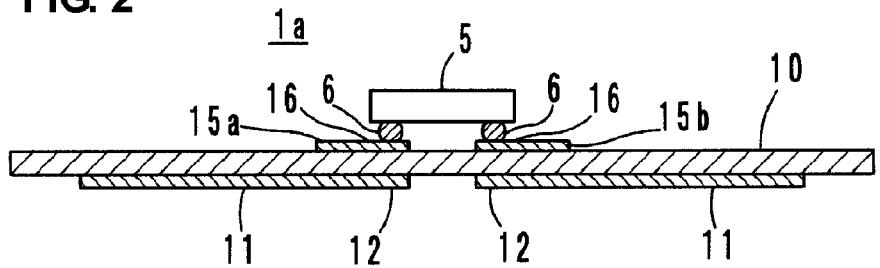
FIG. 2 is a sectional view showing the first preferred embodiment of the present invention.

The wireless IC chip 5 is a known device which includes a clock circuit, a logic circuit, and a memory circuit, and which stores necessary information. The wireless IC chip 5 transmits and receives predetermined high frequency signals. Terminal electrodes of the wireless IC chip 5 are electrically connected to electrode patterns 15a and 15b of the feeder circuit 15 via Au bumps 6 (see FIG. 2), with the electrodes disposed above the electrodes patterns 15a and 15b. The electrical connection may be provided by solder or by a conductive adhesive other than the Au bumps 6.

Similarly to the radiation plates 11, the feeder circuit 15 is also formed of a metal thin film, such as flexible aluminum foil or metal deposition film. Ends 16 of the electrode patterns 15a and 15b oppose ends 12 of the radiation plates 11, with the sheet 10 disposed therebetween, whereby capacitive coupling is established.

The wireless IC device 1a uses the radiation plates 11 to receive a high frequency signal (for example, the UHF frequency band) radiated from a reader/writer (not shown), causes the feeder circuit 15 capacitively coupled with the radiation plates 11 to resonate, and supplies energy to the wireless IC chip 5. In addition, the wireless IC device 1a extracts predetermined energy from the received signal, and in the feeder circuit 15, matches the information stored in the wireless IC chip 5 with a predetermined frequency by using the energy as a drive source. After that, a transmitting signal is conveyed to the radiation plates 11 through the capacitive coupling, and the signal is transmitted and transferred from the radiation plates 11 to the reader/writer.

In the wireless IC device 1a according to the first preferred embodiment, the feeder circuit 15 has a predetermined resonant frequency and a predetermined impedance. The resonant frequency and the impedance are adjusted by changing the depths and/or widths of cutouts 17 provided in the electrode patterns 15a and 15b. In other words, by enlarging the cutouts 17, the impedance is increased. In addition, by increasing the depths of the cutouts 17, an inductance increases and a center frequency (fo) decreases. Such adjustment is performed by trimming the electrode patterns 15a and 15b with a laser or other suitable cutting method. For example, the resonant frequency can be finely adjusted to about 868 MHz, about 915 MHz, about 953 MHz, and other desired frequencies.

As described above, in the wireless IC device 1a, the frequency of the transmitting signal radiated from the radiation plates 11, and the frequency of the received signal supplied to the wireless IC chip 5 are substantially determined by the resonant frequency of the feeder circuit 15. In other words, the center frequency is determined by the feeder circuit 15 regardless of the shape or configuration of the radiation plates 11. By changing the shape of the electrode patterns 15a and 15b of the feeder circuit 15, many different frequencies and impedances can be utilized. High precision is not required when connecting the radiation plates 11 and the feeder circuit 15, and it is not necessary to change the shape of the radiation plates 11. Thus, a signal radiation characteristic does not change. If the radiation plates 11 are rounded or sandwiched between dielectrics, a frequency characteristic does not change. Thus, an attachment location of the wireless IC device 1a can be freely selected, and a stable frequency characteristic is obtained.

Furthermore, capacitive coupling between the radiation plates 11 and the feeder circuit 15 improves anti-surge functionality. Since a surge is a current having a low frequency up to about 200 MHz, the surge can be prevented by a capacitor, and the wireless IC chip 5 can be prevented from being broken due to a surge. In addition, since the radiation plates 11 and the feeder circuit 15 are capacitively coupled, a heating step is not required to couple the radiation plates 11 with the feeder circuit 15. Accordingly, various types of materials can be used for the sheet 10 without regard to the heat resistance of the material.

In addition, an electrical length of each of the radiation plates 11 is about ¼ of resonant frequency λ, and the radiation plates 11 have a total of about ½ of resonant frequency λ. The electrical length of the radiation plates 11 is not necessarily an integer multiple of λ/2. In other words, in preferred embodiments of the present invention, the frequency of the signal radiated from the radiation plates 11 is substantially determined by the resonant frequency of the feeder circuit 15. Thus, a frequency characteristic is not dependent on the electrical length of the radiation plates 11. Preferably, the electrical length of the radiation plates 11 is an integer multiple of $\lambda/2$ so as to maximize the gain. This point also preferably applies to second, third, and fourth preferred embodiments, which are described below.

Second, Third, and Fourth Preferred Embodiments

Figure 3:
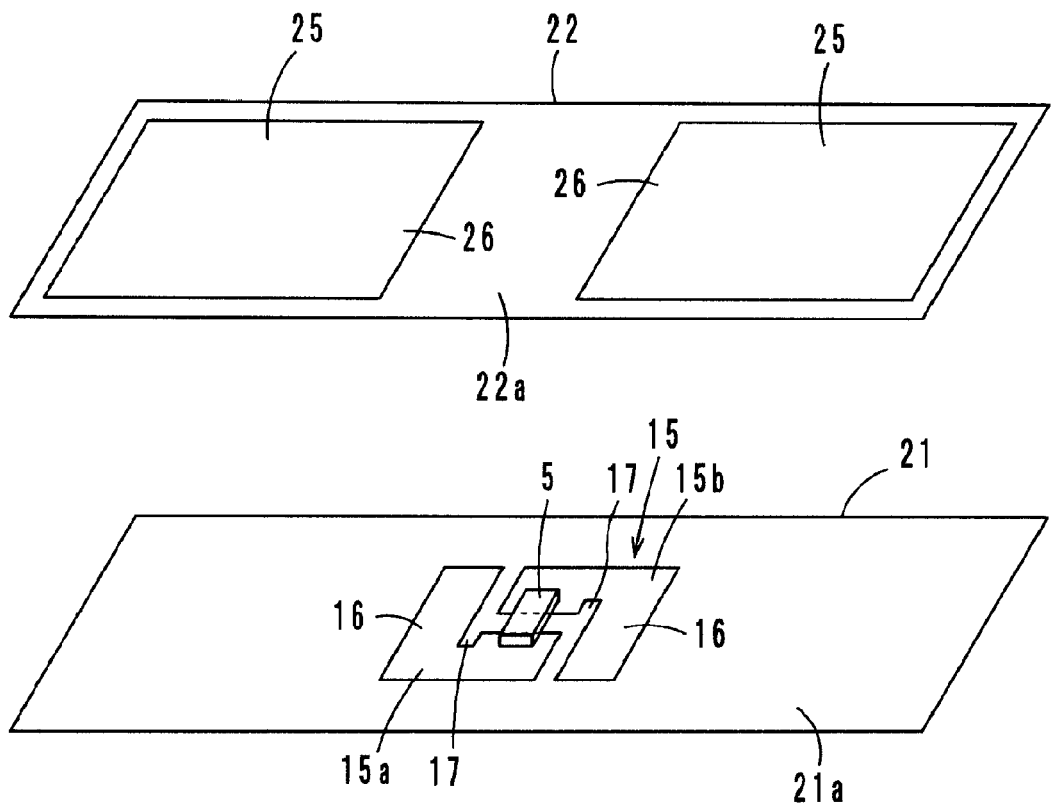
FIG. 3 is an exploded perspective view showing first and second sheets included in second, third, and fourth preferred embodiments of the wireless IC device according to the present invention.

As shown in FIG. 3, each of second, third, and fourth preferred embodiments, which are described below, is formed by bonding two sheets 21 and 22 made of a flexible dielectric or insulator. On a first main surface 21a of the first sheet 21, a feeder circuit 15 is formed with a metal thin film, such as flexible aluminum foil or metal deposition film. A wireless IC chip 5 is mounted on the feeder circuit 15. On a first main surface 22a of the second sheet 22, radiation plates having relatively large areas are formed with a metal thin film, such as flexible aluminum foil or metal deposition film.

Figure 4A:
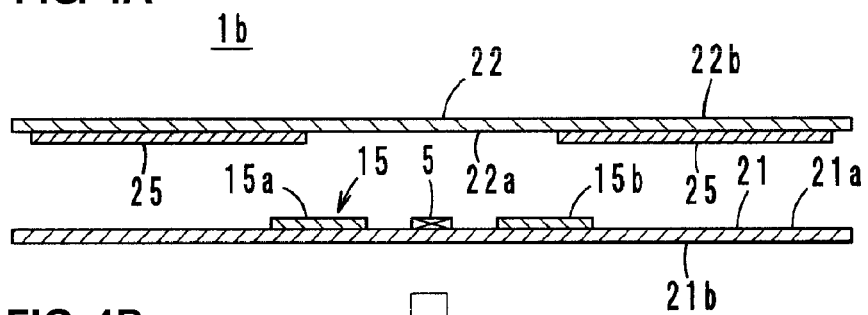
Figure 4B:
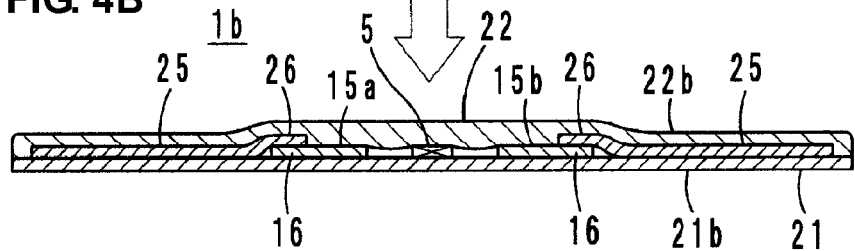

The feeder circuit 15 has substantially the same configuration as the feeder circuit 15 shown in the first preferred embodiment. The wireless IC chip 5 is electrically connected to two electrode patterns 15a and 15b, with the wireless IC chip 5 disposed above the electrode patterns 15a and 15b. In addition, the feeder circuit 15 has a predetermined resonant frequency and a predetermined impedance. As in the first preferred embodiment, the resonant frequency and the impedance are adjusted by changing the depths and/or widths of cutouts Second Preferred Embodiment As shown in FIGS. 4A and 4B, in a wireless IC device 1b according to the second preferred embodiment, the first sheet 21 and the second sheet 22 are bonded to each other by heat bonding so that a first main surface 21a and a first main surface 22a oppose each other. Ends 16 of the feeder circuit 15 and ends 26 of the radiation plates 25 are directly, electrically coupled.

The wireless IC device 1b includes radiation plates 25 to receive a high frequency signal (for example, the UHF frequency band) radiated from a reader/writer (not shown), causes the feeder circuit 15, which is directly and electrically coupled with the radiation plates 25, to resonate, and supplies energy to the wireless IC chip 5. The wireless IC device 1b extracts predetermined energy from the received signal, and in the feeder circuit 15, matches information stored in the wireless IC chip 5 with a predetermined frequency by using the energy as a drive source. Subsequently, a transmitting signal is conveyed to the radiation plates 25 through the direct, electrical coupling, and the signal is transmitted and transferred from the radiation plates 25 to the reader/writer.

Therefore, the operation and advantages of the wireless IC device 1b according to the second preferred embodiment are similar to those of the wireless IC device 1a according to the first preferred embodiment. In addition, the wireless IC chip 5, the feeder circuit 15, and the radiation plates 25 are coated with two sheets 21 and 22. Thus, the wireless IC chip 5, the feeder circuit 15, and the radiation plates 25 are protected from the outside air, which includes moisture. In other words, rust or other corrosion does not occur in the feeder circuit 15 and the radiation plates 25, disengagement of the wireless IC chip 5 is effectively prevented. In addition, connected portions between the ends 16 of the feeder circuit 15 and the ends 26 of the radiation plates 25 will not shift even if they are not fixed to one another.

Furthermore, on second main surfaces 21b and 22b opposite to the first main surfaces 21a and 22a of the sheets 21 and 22, necessary information (for example, advertisement information or a bar code) can be printed.

Third Preferred Embodiment

Figure 5A:
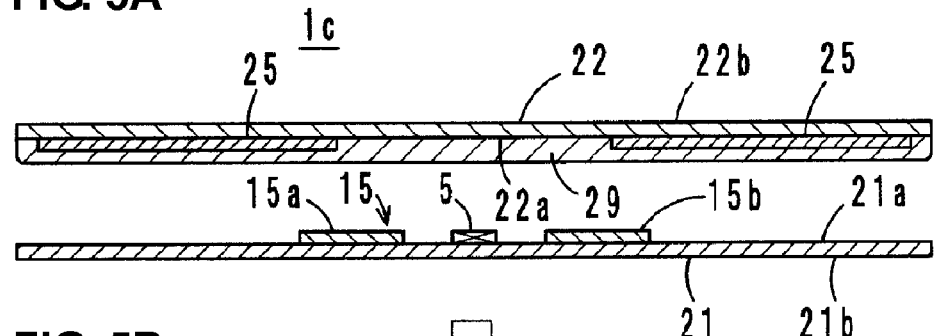
Figure 5B:
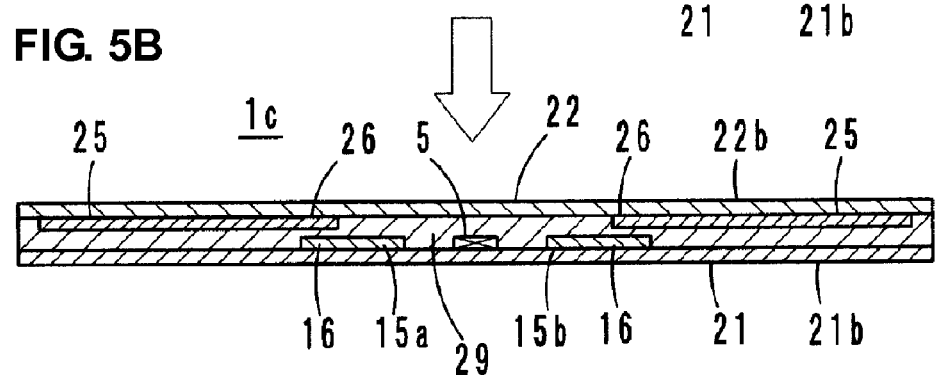

As shown in FIGS. 5A and 5B, in a wireless IC device 1c according to a third preferred embodiment, the first sheet 21 and the second sheet 22 are bonded to each other through an adhesive layer 29 so that a first main surface 21a and a first main surface 22a oppose each other. Ends 16 of the feeder circuit 15 and ends 26 of radiation plates 25 are capacitively coupled with each other through an adhesive layer 29 so as to oppose each other.

The wireless IC device 1c uses radiation plates 25 to receive a high frequency signal (for example, the UHF frequency band) radiated from a reader/writer (not shown), causes the feeder circuit 15 capacitively coupled with the radiation plates 25 to resonate, and supplies energy to the wireless IC chip 5. In addition, the wireless IC device 1c extracts predetermined energy from the received signal, and in the feeder circuit 15, matches information stored in the wireless IC chip 5 with a predetermined frequency by using the energy as a drive source. After that, a transmitting signal is conveyed to the radiation plates 25 through the capacitive coupling, and the signal is transmitted and transferred from the radiation plates 25 to the reader/writer.

Therefore, the operation and advantages of the wireless IC device 1c according to the third preferred embodiment are similar to those of the wireless IC device 1a according to the first preferred embodiment. In addition, the advantages of a construction in which the wireless IC chip 5, the feeder circuit 15, and the radiation plates 25 are coated with two sheets 21 and 22 are similar to that of the wireless IC device 1b according to the second preferred embodiment.

Fourth Preferred Embodiment

Figure 6A:
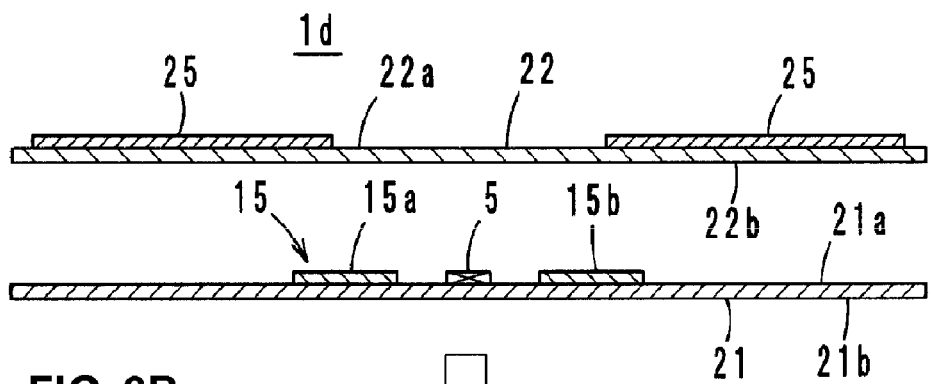
Figure 6B:
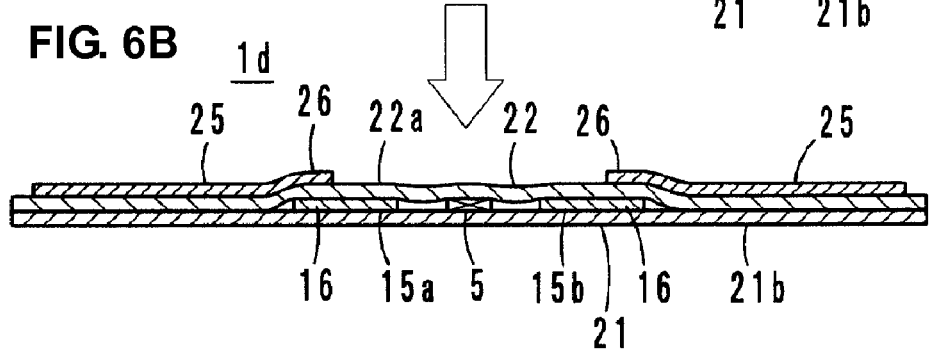

As shown in FIGS. 6A and 6B, in a wireless IC device 1d according to a fourth preferred embodiment, a first sheet 21 and a second sheet 22 are bonded to each other by heat bonding so that a first main surface 21a and a second main surface 22b oppose each other. Ends 16 of the feeder circuit 15 and ends 26 of radiation plates 25 are capacitively coupled to each other with the second sheet 22 provided therebetween.

The wireless IC device 1d uses the radiation plates 25 to receive a high frequency signal (for example, the UHF frequency band) radiated from a reader/writer (not shown), causes the feeder circuit 15 capacitively coupled with the radiation plates 25 to resonate, and supplies energy to the wireless IC chip 5. In addition, the wireless IC device 1d extracts predetermined energy from the received signal, and in the feeder circuit 15, matches information stored in the wireless IC chip 5 with a predetermined frequency by using the energy as a drive source. After that, a transmitting signal is conveyed to the radiation plates 25 through the capacitive coupling, and the signal is transmitted and transferred from the radiation plates 25 to the reader/writer.

Therefore, the operation and advantages of the wireless IC device 1d according to the fourth preferred embodiment are similar to those of the wireless IC device 1a according to the first preferred embodiment. In addition, the advantages of a construction in which the wireless IC chip 5, the feeder circuit 15, and the radiation plates 25 are coated with two sheets 21 and 22 are similar to that of the wireless IC device 1b according to the second preferred embodiment.

The wireless IC device according to the present invention is not limited to the above-described preferred embodiments, and can be variously modified within the scope of the present invention.

For example, a detailed construction of the wireless IC chip 5 is optional, and specific shapes of the feeder circuit 15, and the radiation plates 11 and 25 are optional.

As described above, the present invention is useful in a wireless IC device used in an RFID system. In particular, it is superior in determining a frequency characteristic and impedance without depending on an antenna and in ease of production.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless IC device comprising:
    a flexible sheet including a wireless IC chip, radiation plates, and a feeder circuit provided thereon; wherein
    the feeder circuit has a predetermined resonant frequency and a predetermined impedance;
    the wireless IC chip is connected to the feeder circuit;
    the feeder circuit and the radiation plates are coupled with each other such that a transmitted signal is radiated from the radiation plates and a received signal is supplied to the wireless IC chip; and
    the feeder circuit has a structure such that the predetermined resonant frequency thereof substantially corresponds to a resonant frequency of at least one of the transmitted signal or the received signal.

2. The wireless IC device according to claim 1, wherein the feeder circuit includes an electrode pattern, and a cutout arranged to adjust the predetermined resonant frequency and the impedance is provided in the electrode pattern of the feeder circuit.

3. The wireless IC device according to claim 1, wherein the radiation plates are defined by flexible metal films on the flexible sheet.

4. The wireless IC device according to claim 1, wherein
    the wireless IC chip and the feeder circuit are provided on a first main surface of the flexible sheet, and the radiation plates are provided on a second main surface of the flexible sheet opposite to the first main surface; and
    the feeder circuit and the radiation plates are capacitively coupled with each other through the flexible sheet.

5. The wireless IC device according to claim 1, wherein
    the flexible sheet includes a flexible first sheet and a flexible second sheet;
    the wireless IC chip and the feeder circuit are provided on a first main surface of the flexible first sheet, and the radiation plates are provided on a first main surface of the flexible second sheet; and
    the flexible first and second sheets are bonded to each other so that the first main surface of the flexible first sheet and the first main surface of the flexible second sheet oppose each other, and the feeder circuit and the radiation plates are coupled with each other.

6. The wireless IC device according to claim 5, wherein the feeder circuit and the radiation plates are directly electrically coupled with each other.

7. The wireless IC device according to claim 5, wherein the feeder circuit and the radiation plates are capacitively coupled with each other through an adhesive layer disposed between the flexible first and second sheets.

8. The wireless IC device according to claim 1, wherein
    the flexible sheet includes a flexible first sheet and a flexible second sheet;
    the wireless IC chip and the feeder circuit are provided on a first main surface of the flexible first sheet, and the radiation plates are provided on a first main surface of the flexible second sheet, and
    the flexible first and second sheets are bonded to each other so that the first main surface of the flexible first sheet and a second main surface opposite to the first main surface of the flexible second sheet oppose each other, and the feeder circuit and the radiation plates are capacitively coupled with each other through the flexible second sheet.

9. The wireless IC device according to claim 1, wherein the wireless IC chip is connected to the feeder circuit via at least one Au bump.

* * * * *